United States Patent [19]

Nishioka et al.

[11] Patent Number: 4,636,400

[45] Date of Patent: Jan. 13, 1987

[54] METHOD OF TREATING SILICON NITRIDE FILM FORMED BY PLASMA DEPOSITION

[75] Inventors: Tadashi Nishioka; Hiroshi Koyama; Yoji Mashiko, all of Itami, Japan

[73] Assignee: Mitsubishi Denki Kabushiki Kaisha, Tokyo, Japan

[21] Appl. No.: 773,918

[22] Filed: Sep. 9, 1985

[30] Foreign Application Priority Data

Sep. 7, 1984 [JP] Japan .................. 59-188424

[51] Int. Cl.⁴ .............................. B05D 3/06
[52] U.S. Cl. .................... 427/39; 427/53.1; 427/54.1; 427/94; 204/157.15
[58] Field of Search ............ 427/38, 39, 54.1, 53.1, 427/94; 204/157.1 R

[56] References Cited

U.S. PATENT DOCUMENTS

| | | | |
|---|---|---|---|
| 4,181,751 | 1/1980 | Hall et al. | 427/94 |
| 4,229,502 | 10/1980 | Wu et al. | 427/53.1 |
| 4,277,320 | 7/1981 | Beguwala et al. | 427/53.1 |
| 4,469,715 | 9/1984 | Madan | 427/94 |
| 4,495,218 | 1/1985 | Azuma et al. | 427/94 |

*Primary Examiner*—John H. Newsome
*Attorney, Agent, or Firm*—Sughrue, Mion, Zinn, Macpeak and Seas

[57] ABSTRACT

A method of treating a silicon nitride film formed by plasma deposition and deposited on a substrate, which comprises: (1) irradiating the silicon nitride film, and (2) heating the silicon nitride film during the irradiating.

3 Claims, 2 Drawing Figures

METHOD OF TREATING SILICON NITRIDE FILM FORMED BY PLASMA DEPOSITION

BACKGROUND OF THE INVENTION

This invention relates to a method of treating a silicon nitride film formed by plasma deposition (hereinafter called "plasma silicon nitride film"), to prevent cracking of the silicon nitride film which is used for manufacturing semiconductor devices.

One conventional method for preventing the formation of cracks in a plasma silicon nitride film is a method dependent upon controlling the various parameters involved in forming the film such as pressure, amount of gas flow, and concentration ratio between monosilane and ammonia gas, (M. J. Rand; *J. Vac. Sci. Technol.*, Vol. 16, 1979, p. 420). According to this method, conditions are selected in which inner stress which causes cracks is minimized by optimization of the various parameters involved in forming the film. After the film is formed, no special treatment for preventing cracks is employed.

In the conventional method described above, it is necessary to control many parameters, and it is very difficult to maintain the optimum conditions because the film forming equipment usually has different characteristics from one piece of equipment to the next.

Further, effective high temperature heat treatment (annealing) to reduce inner stress cannot be applied to the film because most semiconductor devices have aluminum connection layers which are covered by the plasma silicon nitride film and which would melt during the high temperature heat treatment.

SUMMARY OF THE INVENTION

Accordingly, it is an object of the present invention to provide a method for preventing cracking of a plasma silicon nitride film.

It is another object of the present invention to provide a method for preventing cracking of a plasma silicon nitride film by which inner stress is reduced at a comparatively low temperature.

Other and further objects and features of the invention will become apparent from the following description and are accomplished by providing a method of treating a silicon nitride film formed by plasma deposition and deposited on a substrate, which comprises: (1) irradiating the silicon nitride film, and (2) heating the silicon nitride film during the irradiating.

DESCRIPTION OF THE PREFERRED EMBODIMENT

Figure 1:
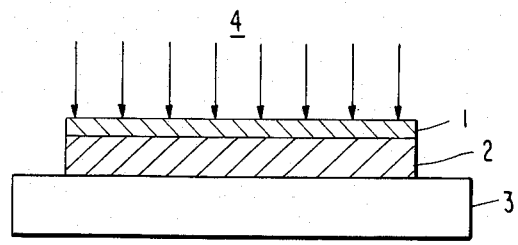
FIG. 1 is a schematic illustration of the method according to the invention.

Referring now to FIG. 1, there is illustrated a method of treating a plasma silicon nitride film according to the present invention. Plasma silicon nitride film 1 is deposited on a semiconductor element 2 according to conventional methods. Semiconductor element 2 is not a final semiconductor device, but is an intermediate in the manufacture of the semiconductor device. Semiconductor element 2 is placed on a heat source 3, which heats the plasma silicon nitride film via semiconductor element 2.

The heat source 3 is capable of heating the semiconductor element 2 and the plasma silicon nitride film 1. The temperature to which the semiconductor element 2 and the plasma silicon nitride film is heated is preferably between 200° C. and 300° C. One of ordinary skill in the art can readily determine suitable heat sources. In a modification of the method, heat source 3 can be a radiation heater such as an infrared lamp.

Light 4 irradiates the plasma silicon nitride film. The light 4 is uniformly applied and thus, is of uniform intensity. Further, the light 4 preferably has a wave length between 200 nm and 600 nm and has an intensity of more than 10 W/cm$^2$.

The light is generated by a light source (not shown), easily selected by one of ordinary skill in the art. Examples of such a light source include a high pressure mercury-arc lamp or xenon lamp.

In general, the organization of a plasma silicon nitride film differs from stoichiometric organization, and the film is amorphous comprising many hydrogen atoms. Therefore, from the standpoint of atomic structure, there exist great fluctuations of atomic density and the coordination number. These fluctuations cause high inner stress which in turn causes cracks.

However, according to the present invention, as light 4 irradiates the plasma silicon nitride film, energy from photons generates chemically reactive species which in turn can participate in a variety of chemical reactions. For example, atomic and molecular bonds are broken and recombination, translation, rotation, vibration and generation of radicals can occur. As a result, fluctuations of atomic density and coordination number in the film are reduced. Reduction of fluctuations of atomic density and coordination number in turn reduces inner stress of the plasma silicon nitride film.

Heating the film with a heat source 3 promotes the above phenomenon for preventing crack formation. However, if the film is heated without irradiating light 4, it is necessary to maintain a high temperature for a long time in order to reduce inner stress of the amorphous structure.

Figure 2:
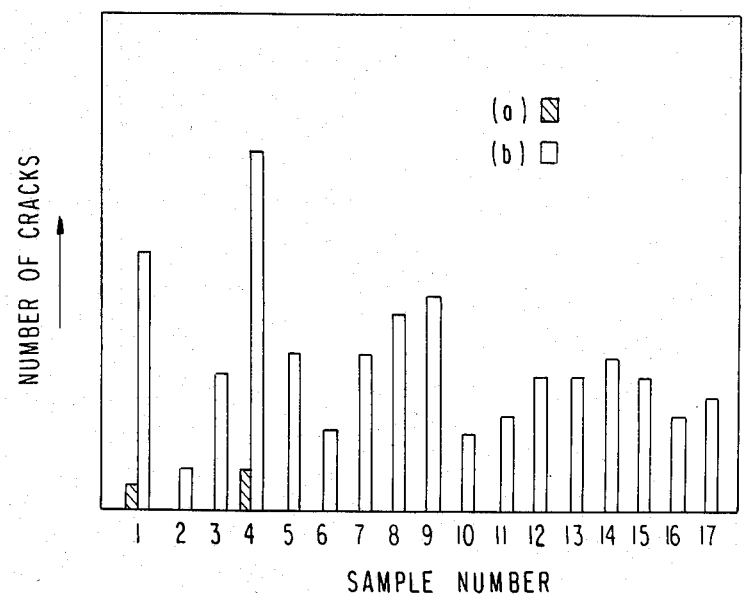
FIG. 2 is a graphical representation comprising test results using the method of the present invention and using the conventional method.

Referring now to FIG. 2, the effect of the present invention is graphically shown. The longitudinal axis indicates the number of cracks at the corner point of the aluminum connection layer, the transverse axis indicates sample numbers, and (a) and (b) indicate test results according to the invention and the conventional method, respectively. Comparison of (a) and (b) in FIG. 2 shows that most samples processed according to the conventional method have many cracks. In contrast, according to the present invention, only sample numbers 1 and 4 had cracks and the number of cracks was very low. None of the other samples according to the present invention had any cracks whatsoever.

FIG. 2 demonstrates that the method of the invention is effective for preventing the formation of cracks.

Further, the method of the present invention may easily be applied to large semiconductor elements having a large diameter semiconductor wafer. This is because the number of control parameters in the treating process is reduced, and thus it is possible to keep the process stable.

While the invention has been described in detail, and with reference to specific embodiments thereof, it will be apparent to one skilled in the art that various changes and modifications can be made therein without departing from the spirit and scope thereof.

What is claimed is:

1. A method of treating a silicon nitride film formed by plasma deposition and deposited on a substrate, which comprises: (1) irradiating said silicon nitride film, and (2) heating said silicon nitride film during said irradiating.

2. A method as claimed in claim 1, wherein said silicon nitride film is heated between 200° C. and 300° C.

3. A method as claimed in claim 1, wherein said irradiating is accomplished with light having a wavelength between 200 nm and 600 nm and having an intensity of more than 10 W/cm$^2$.